(12) United States Patent
Bonfiglio

(10) Patent No.: US 7,746,935 B2
(45) Date of Patent: Jun. 29, 2010

(54) DIGITAL AMPLIFIER SYSTEM FOR DRIVING A CAPACITIVE LOAD

(75) Inventor: Joseph William Bonfiglio, Pepperall, MA (US)

(73) Assignee: Xienetics, Inc., Devens, MA (US)

( * ) Notice: Subject to any disclaimer, the term of this patent is extended or adjusted under 35 U.S.C. 154(b) by 1351 days.

(21) Appl. No.: 11/129,521

(22) Filed: May 13, 2005

(65) Prior Publication Data

US 2006/0256874 A1    Nov. 16, 2006

(51) Int. Cl.
*H04B 14/04* (2006.01)
(52) U.S. Cl. .................................. 375/242; 327/111
(58) Field of Classification Search ............ 310/316.01, 310/311, 321, 323.01, 323.17; 700/11, 19, 700/56; 359/224; 375/237–328; 327/110–111, 327/100, 108
See application file for complete search history.

(56) References Cited

U.S. PATENT DOCUMENTS

| 5,166,508 | A | 11/1992 | Davis et al. |
| 5,617,058 | A | 4/1997 | Adrian et al. |
| 5,754,079 | A | 5/1998 | Delano |
| 5,760,755 | A | 6/1998 | Engle |
| 5,777,512 | A | 7/1998 | Tripathi et al. |
| 6,107,844 | A | 8/2000 | Berg et al. |
| 6,362,679 | B2 | 3/2002 | Wile |
| 6,424,076 | B1 | 7/2002 | Gullapalli |
| 6,580,332 | B2 | 1/2003 | Sutliff et al. |
| 6,621,339 | B2 | 1/2003 | Tripathi et al. |
| 6,577,194 | B2 | 6/2003 | Delano |
| 6,608,576 | B1 * | 8/2003 | Borgen .......................... 341/143 |
| 6,781,458 | B2 | 8/2004 | Mazda |
| 7,013,183 | B1 | 3/2006 | Solomon |
| 7,054,176 | B2 * | 5/2006 | Moussaoui et al. ............ 363/71 |
| 2003/0123681 | A1 * | 7/2003 | Furst et al. .................. 381/111 |
| 2005/0002087 | A1 | 1/2005 | Knowles et al. |
| 2005/0122168 | A1 * | 6/2005 | Mazda ....................... 330/251 |

(Continued)

FOREIGN PATENT DOCUMENTS

EP           844627 A2       5/1998

(Continued)

OTHER PUBLICATIONS

Tripath Technology, Inc. Technical Information, TA2022, *Stereo 90W Class-T Digital Audio Amplifier Driver Using Digital Power Processing (DPP) Technology*, Revision 1.0, Nov. 2001, pp. 1, 13, 29
Tripath Technology, Inc. TCD600 6 *Channel Class-T Digital Audio Processor Using Digital Power Processing Technology* Revision 0.99, Aug. 2004, pp. 1, 32, 33.

(Continued)

*Primary Examiner*—Shuwang Liu
*Assistant Examiner*—James M Perez
(74) *Attorney, Agent, or Firm*—Iandiorio Teska & Coleman

(57) ABSTRACT

A digital amplifier system for driving a capacitive load includes a digital amplifier controller responsive to a digital input command for producing a pulse density modulation signal representative of the digital input command; a switching amplifier for amplifying the pulse density modulation signal and an inductive filter for demodulating the amplified pulse density modulation signal to provide a drive current to drive a capacitive load in response to the digital input command.

25 Claims, 5 Drawing Sheets

U.S. PATENT DOCUMENTS

| | | | |
|---|---|---|---|
| 2005/0122241 A1* | 6/2005 | Magrath | 341/76 |
| 2006/0114057 A1* | 6/2006 | Makino et al. | 330/10 |
| 2006/0132231 A1* | 6/2006 | Ishii et al. | 330/10 |
| 2006/0142877 A1* | 6/2006 | Solomon | 700/11 |

FOREIGN PATENT DOCUMENTS

| | | |
|---|---|---|
| EP | 1030206 A2 | 8/2000 |
| EP | 1365270 A1 | 11/2003 |

OTHER PUBLICATIONS

Tripath Technology, Inc. TK2150, *Stereo 200W (6 omega) Class-T Digital Audio Amplifier Driver Using Digital Power Processing Technology* Revision 1.2, Nov. 2003, pp. 1, 28, 28, 30.

* cited by examiner

DIGITAL AMPLIFIER SYSTEM FOR DRIVING A CAPACITIVE LOAD

FIELD OF THE INVENTION

This invention relates to a digital amplifier system for driving a capacitive load, and more particularly to such a digital amplifier system for driving a capacitive actuator for a deformable mirror.

BACKGROUND OF THE INVENTION

Typically the high voltage driver systems in use to drive capacitive actuators for deformable mirrors are based on analog technology. A microprocessor delivers a digital input command to a digital to analog converter (DAC) which drives an amplifier to supply drive current to the capacitive actuator. The amplifier typically has a totem pole output stage using bipolar transistors. To keep control over the output stage a bias current must be maintained. With even a small bias current at the 100 volts required by the actuator the power drain is considerable e.g., 2 watts. Considering that many deformable mirrors require 1000 channels (actuators) or more the power loss e.g. 2000 w can build up quickly. Add to this that analog amplifiers are generally only about 40% efficient and power supplies are only typically 50-75% efficient the amount of power required can become a major factor. Further, large amounts of power require large heat sinks which mean heavier and larger packages which translates into overall larger and more robust packages to contain the additional weight and size, all of which further increases cost as well. Another shortcoming of analog systems is that the voltage must be monitored at the load. This means monitoring an analog voltage of, for example, 100 volts. This must be scaled down and then converted to digital form through an analog to digital converter (ADC) for feedback to the digital microprocessor. And all of this scaling and conversion introduces more inefficiency to the system. Another disadvantage of the analog approach is that typically the best accuracy obtainable with the DAC and ADC are 16 bits which translates for a 100 volt supply to approximately 1.5 mv/lsb. Analog systems also produce overshoot and ringing as a result of driving a reactive load with a voltage. And the ringing can be at a frequency that is low enough for the actuator to physically respond yet high enough so that the amplifier cannot quickly correct.

BRIEF SUMMARY OF THE INVENTION

It is therefore an object of this invention to provide a digital amplifier system for driving a capacitive load.

It is a further object of this invention to provide such a digital amplifier system for driving a capacitive load which has higher efficiency than an equivalent analog system.

It is a further object of this invention to provide such a digital amplifier system for driving a capacitive load which has broader bandwidth.

It is a further object of this invention to provide such a digital amplifier system for driving a capacitive load which has greater resolution.

It is a further object of this invention to provide such a digital amplifier system for driving a capacitive load which has much higher slew rate.

It is a further object of this invention to provide such a digital amplifier system for driving a capacitive load which is lower in weight, volume and cost.

It is a further object of this invention to provide such a digital amplifier system for driving a capacitive load in which the high sampling rate of the drive current allows more precise control which reduces ringing and overshoot.

It is a further object of this invention to provide such a digital amplifier system for driving a capacitive load in which the output noise is above the frequency to which the actuator can respond.

The invention results from the realization that an improved, digital amplifier system for driving a capacitive load can be achieved with a digital amplifier controller which responds to a digital input command to produce a pulse density modulation signal to drive a switching amplifier to supply current through a demodulating inductive filter to a capacitive load to drive it in accordance with the digital input.

The subject invention, however, in other embodiments, need not achieve all these objectives and the claims hereof should not be limited to structures or methods capable of achieving these objectives.

This invention features a digital amplifier system for driving a capacitive load including a digital amplifier controller responsive to a digital input command for producing a pulse density modulation signal representative of the digital input command. A switching amplifier amplifies the pulse density modulation signal and an inductive filter demodulates the amplified pulse density modulation signal to provide a drive current to drive a capacitive load in response to the digital input command.

In a preferred embodiment the digital amplifier control may include a pulse code modulation converter for transforming the digital input command to a pulse code modulation signal. The digital amplifier controller may include a pulse width modulation converter for transforming the pulse code modulation signal to a pulse width modulation signal. The digital amplifier controller may include a pulse density modulation converter for transforming the pulse width modulation signal to a pulse density modulation signal. The pulse code modulation converter may include a field programmable gate array. The pulse width modulation converter may include a digital signal processor (DSP). The digital signal processor (DSP) may be at least partially configured as a $\Sigma\Delta$ converter. The pulse density modulation converter may include a power processor. The power processor may include a resonant FET driver. The pulse width modulation converter and the pulse density modulation converter may be configured as a class T amplifier. The capacitive load may be an actuator for a deformable mirror. There may be a microprocessor for providing the digital input command. The switching amplifier may include a ½ H bridge; it may include a pair of MOSFET transistors. The pair of MOSFET transistors may be independently driven by the power processor. The MOSFET transistors may be N channel MOSFETS.

The invention also features a digital amplifier system for driving a capacitive actuator including a digital amplifier controller responsive to a digital input command for producing a pulse density modulation signal representative of the digital input command. A switching amplifier amplifies the pulse density modulation signal. There is an inductive filter for demodulating the amplified pulse density modulation signal to provide a drive current to drive a capacitive actuator in response to the digital input command.

The invention also features a digital amplifier system for driving a capacitive actuator for a deformable mirror system including a digital amplifier controller responsive to a digital input command for producing a pulse density modulation signal representative of the digital input command, and a switching amplifier for amplifying the pulse density modulation signal. An inductive filter demodulates the amplified pulse density modulation signal to provide a drive current to drive a capacitive actuator for a deformable mirror system in response to the digital input command.

In a preferred embodiment the digital amplifier control may include a pulse code modulation converter for transforming the digital input command to a pulse code modulation signal. The digital amplifier controller may include a pulse width modulation converter for transforming the pulse code modulation signal to a pulse width modulation signal. The digital amplifier controller may include a pulse density modulation converter for transforming the pulse width modulation signal to a pulse density modulation signal. The pulse code modulation converter may include a field programmable gate array. The pulse width modulation converter may include a digital signal processor (DSP). The digital signal processor (DSP) may be configured as a $\Sigma\Delta$ converter. The pulse density modulation converter may include a power processor. The power processor may include a resonant FET driver. The pulse width modulation converter and the pulse density modulation converter may be configured as a class T amplifier. There may be a microprocessor for providing the digital input command. The switching amplifier may include a ½ H bridge; it may include a pair of MOSFET transistors. The pair of MOSFET transistors may be independently driven by the power processor. The MOSFET transistors may be N channel MOSFETS.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
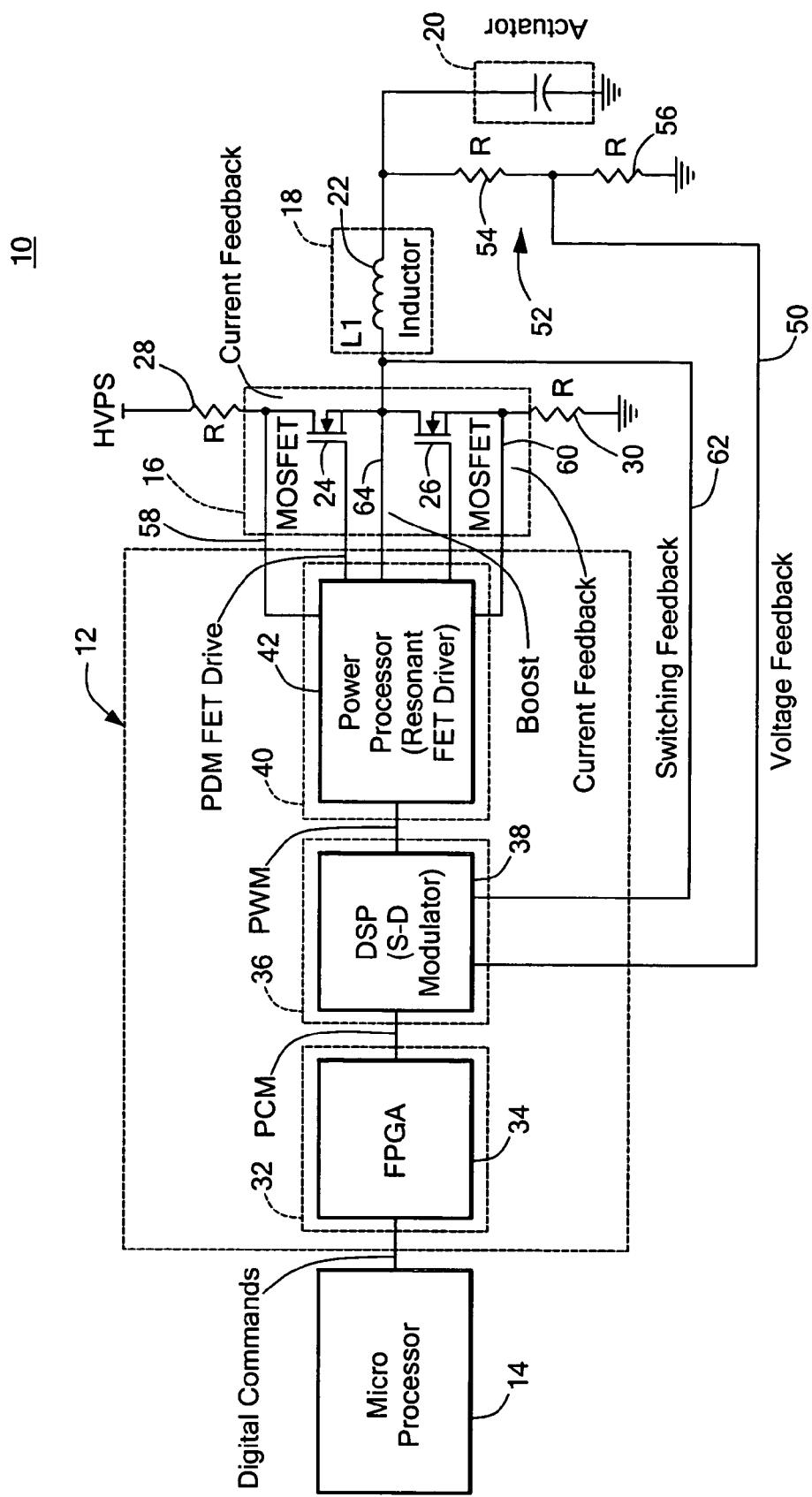
FIG. 1 is a schematic block diagram of a digital amplifier system for driving a capacitive load according to this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a digital amplifier system 10 for driving a capacitive load including a digital amplifier controller 12 which is responsive to a digital input command from, for example, a microprocessor 14 to produce a pulse density modulation signal representative of that digital input command to a switching amplifier 16. An inductive filter 18 demodulates the amplified pulse density modulation signal from switching amplifier 16 to provide a drive current to drive a capacitive load, such as actuator 20, which may, for example, be one of a multiplicity of actuators used to control the shape of a deformable mirror.

Inductive filter 18 may include inductor 22 having inductance of 18 microhenrys, for example, for a capacitive actuator which has an impedance of ½ to 2 microfarads. Switching amplifier 16 may include an H bridge or ½ H bridge as shown including two totem pole connected MOSFET transistors 24, 26 with two current sensing resistors 28 and 30. Digital amplifier controller 12 may include a pulse code modulation converter 32 for transforming the digital input command to a pulse code modulation signal. The pulse code modulation converter 32 may be implemented using a field programmable gate array 34. Digital amplifier controller 12 may also include a pulse width modulation converter 36 for transforming the pulse code modulation signal to a pulse width modulation signal. Pulse width modulation converter 36 may include a digital signal processor (DSP) 38 at least a portion of which is configured to function as a $\Sigma\Delta$ modulator. Digital amplifier controller 12 further includes a pulse density modulation converter 40 for transforming the pulse width modulation signal to a pulse density modulation signal. Pulse density modulation converter 40 may include power processor 42 which may be implemented with a resonant FET driver. The pulse width modulation converter 36 and pulse density modulation converter 40 may be implemented with a "T" class amplifier such as TCD-6000 TP 2150B chipset obtainable from Tripath Technology, Inc. San Jose, Calif., and described in U.S. Pat. No. 6,362,679, issued Mar. 26, 2002, Wile, entitled POWER DEVICE DRIVER CIRCUIT; U.S. Pat. No. 6,107,844, issued Aug. 22, 2000, Berg et al, entitled METHODS AND APPARATUS FOR REDUCING MOSFET BODY DIODE CONDUCTION IN A HALF-BRIDGE CONFIGURATION; U.S. Pat. No. 5,777,512 issued Jul. 7, 1998, Tripathi et al, entitled METHOD AND APPARATUS FOR OVERSAMPLED, NOISE-SHAPING, MIXED SIGNAL PROCESSING and U.S. Pat. No. 6,577,194 issued Jun. 10, 2003, Delano, entitled RESONANT GATE DRIVE TECHNIQUE FOR A DIGITAL POWER AMPLIFIER, all of which are herein incorporated in their entirety by this reference.

In operation the field programmable gate array 34 generates a pulse code modulation (PCM) bit stream corresponding to the desired actuator command. The PCM is then converted to a pulse width modulation (PWM) signal by the $\Sigma\Delta$ modulator running as a part of the digital signal processor (DSP) 38. The PWM signal is then processed into a spread spectrum pulse density modulation (PDM) signal by the resonant FET driver of power processor 42 using a Tripath class "T" amplifier Model TP 2150 and applied to the ½ bridge switching amplifier 16. The output switching waveform from the totem pole connected MOSFETS 24 and 26 is passed through inductor 22 which demodulates the switching pattern into a base band signal which can then drive the capacitive actuator 20.

Switching feedback, voltage feedback and current feedback are all provided. Voltage feedback is provided over line 50 to stop the drive when the voltage on the load reaches the desired value. Voltage feedback is derived from bridge 52 consisting of bridge resistors 54 and 56 which may for example be 10K ohm and 1K ohm, respectively. Current feedback is provided over lines 58 and 60 derived from the current sensing resistors 28 and 30 respectively. The current feedback provides control over the current applied to the load on a cycle by cycle basis. Switching feedback is provided on line 62 to control drive signals such as dead time in the bridge. Boost feedback is also provided on line 64 to provide a pumped FET drive for the top FET 24 in the H bridge and also steers current from the load back into the power rail, thereby further increasing efficiency of the system. Note, none of the feedback needs to be derived directly from the load and so none need to be connected to the actuator at the deformable mirror site, for example.

Figure 2:
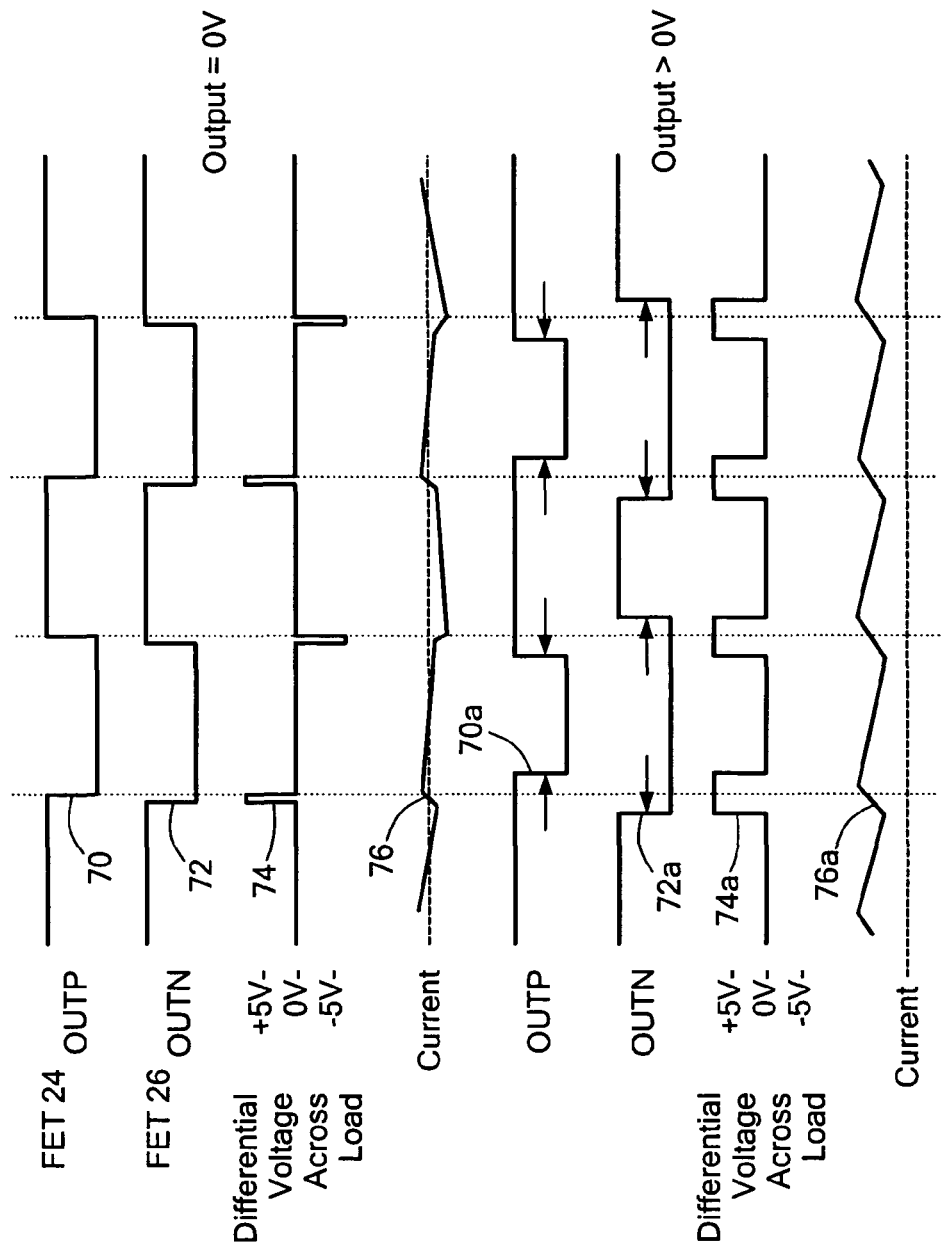
FIG. 2 is illustrates waveforms occurring in the system of FIG. 1.

The make/break times 70, 72, FIG. 2, of the FET 24 and FET 26 outputs establish the idle voltage 74 resulting in a very low ripple output current 76. This current is raised and lowered as at 76*a* by simply shifting the make and break points 70*a*, 72*a* which also increases the idle current 74*a*. Note, however, that although the current 76*a* has increased the ripple has not and thus the AC factor which tends to overdrive and overheat the passive actuator is stable and small.

Figure 3:
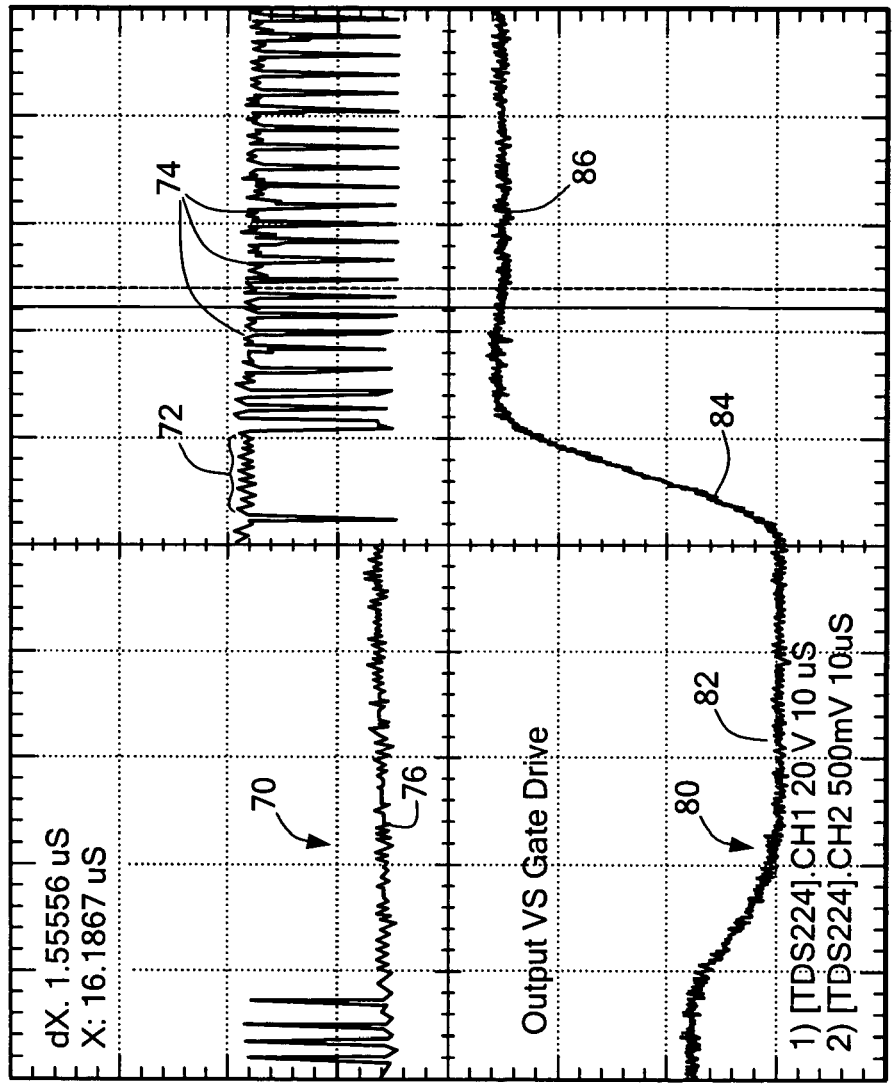
FIG. 3 is an enlarged illustration of the waveform of the top FET drive and output at the load for the system of FIG. 1.

The efficacy of the digital amplifier system according to this invention can be better understood with reference to the output of switching amplifier 16 shown in FIG. 3. Specifically, the top trace 70 is the actual gate drive to FET 24 showing it as only active when the load is slewing as at 72. The short pulses are the inherent burst mode that distinguishes class T amplifiers from class D amplifiers. FET 24 is on when the trace is high. During the slew at 72, FET 24 is on for a long time, but when the load gets to the new level FET 24 only pulses on as necessary, as shown at 74, to keep the voltage at the load at the commanded value. Whether at the higher level 74 or lower level at 76 very little power is dissipated and really the only significant power dissipated is during the slewing 72. Also shown in FIG. 3, is the trace 80 of the output at the load where the low level 82 slew 84 and new higher level 86 can be clearly seen.

Figure 4:
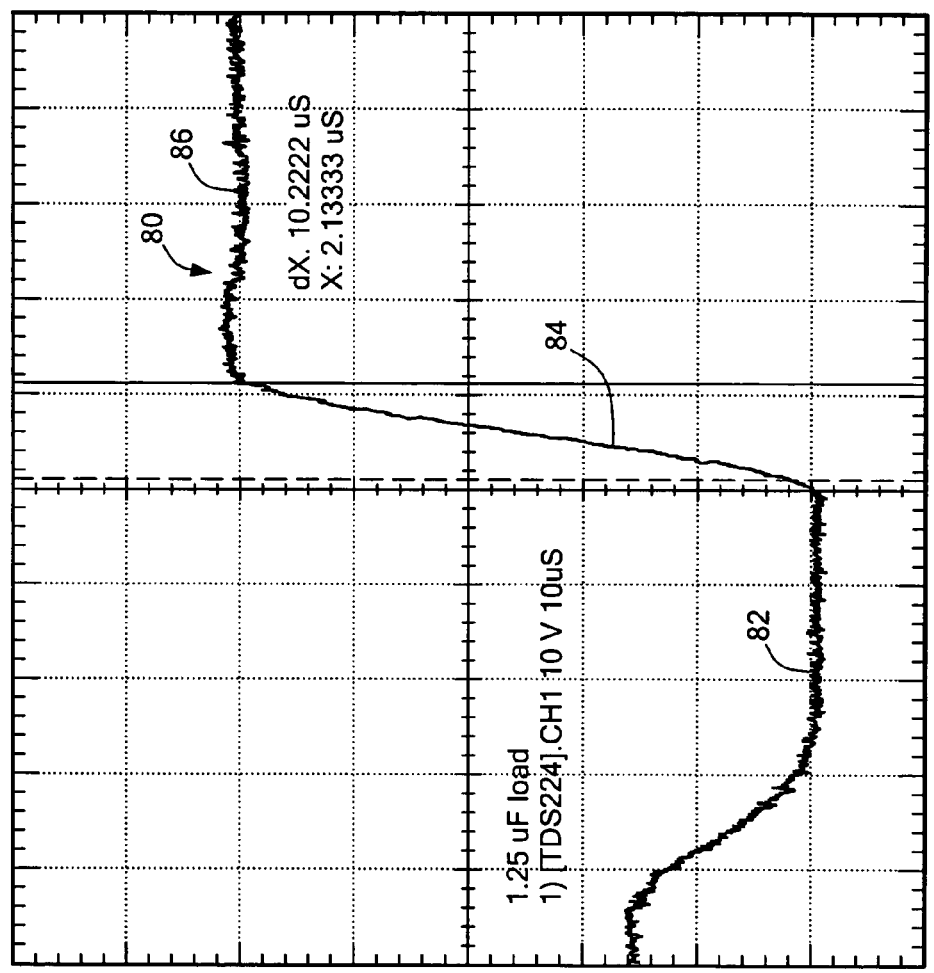
FIG. 4 is a further enlarged illustration of the output at the load of FIG. 3 evidencing the high slew rate obtainable with this invention.

An enlarged view of trace 80, FIG. 4, showing the low level 82, slew 84, and a new level 86 evidences the truly improved performance of this invention which achieves a 5 volt per microsecond slew rate. Here the slew period 84 shows a 50 volt slew in just 10 microseconds with the load attached. That's approximately 8.5 amps/10 microseconds. Also note that there is no overshoot or ringing at transition region 88 because of the high sample rate e.g. 192 KHz.

Figure 5:
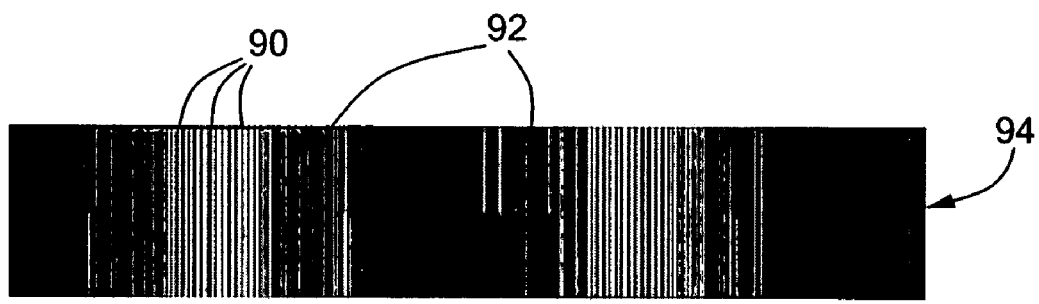
FIG. 5 illustrates a typical pulse width density waveform at the power stage output to the load.

Thus it can be seen that the amplifier of this invention is a current mode amplifier which servos on the output current as well as the output voltage. By controlling the current in the load the slew rate, drive current, and frequency response of each channel can be tailored in software. This amplifier also provides a uni-polar output from 0 to 120 volts which eliminates the requirement for a separate bias supply and allows the use of a ground referenced mirror. Moreover, each actuator can be individually biased because the amplifier can digitally offset each channel separately as required to flatten or shape the mirror without losing any dynamic range. In addition this digital system has excellent noise immunity since the data is discreet, 1 and 0 levels, rather than an analog signal that must be amplified. By changing both the width 90, FIG. 5, and phase 92 of PDM 94 the FET switching amplifier 16 is made more efficient and the ripple current through the capacitive load 20 is much less.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A digital amplifier system for driving a capacitive actuator for a deformable mirror system comprising:
    a digital amplifier controller responsive to a digital input command for producing a pulse density modulation signal representative of said digital input command, said digital amplifier controller including a pulse code modulation converter for transforming said digital input command to a pulse code modulation signal, a pulse width modulation converter for transforming said pulse code modulation signal to a pulse width modulation signal, and a pulse density modulation converter for transforming said pulse width modulation signal to a pulse density modulation signal;
    a switching amplifier for amplifying said pulse density modulation signal; and
    an inductive filter for demodulating said amplified pulse density modulation signal to provide a drive current to drive the capacitive actuator for the deformable mirror system in response to the digital input command.

2. The digital amplifier system of claim 1 in which said pulse code modulation converter includes a field programmable gate array.

3. The digital amplifier system of claim 1 in which said pulse width modulation converter includes a digital signal processor (DSP).

4. The digital amplifier system of claim 1 in which said pulse width modulation converter includes a $\Sigma\Delta$ converter.

5. The digital amplifier system of claim 1 in which said pulse density modulation converter includes a power processor.

6. The digital amplifier system of claim 5 in which said power processor includes a resonant FET driver.

7. The digital amplifier system of claim 5 in which said switching amplifier includes a pair of MOSFET transistors independently driven by said power processor.

8. The digital amplifier system of claim 1 in which said pulse width modulation converter and said pulse density modulation converter are configured as a class T amplifier.

9. The digital amplifier system of claim 1 including a microprocessor for providing said digital input command.

10. The digital amplifier system of claim 1 in which said switching amplifier includes a ½ H bridge.

11. The digital amplifier system of claim 1 in which said switching amplifier includes a pair of MOSFET transistors.

12. The digital amplifier system of claim 11 in which said MOSFET transistors are N channel MOSFETS.

13. A digital amplifier system for driving a capacitive load comprising:
    a digital amplifier controller responsive to a digital input command for producing a pulse density modulation signal representative of said digital input command, said digital amplifier controller including a pulse code modulation converter for transforming said digital input command to a pulse code modulation signal, a pulse width modulation converter for transforming said pulse code modulation signal to a pulse width modulation signal, and a pulse density modulation converter for transforming said pulse width modulation signal to a pulse density modulation signal;

a switching amplifier for amplifying said pulse density modulation signal; and an inductive filter for demodulating said amplified pulse density modulation signal to provide a drive current to drive the capacitive load in response to the digital input command.

14. The digital amplifier system of claim 13 in which said pulse code modulation converter includes a field programmable gate array.

15. The digital amplifier system of claim 13 in which said pulse width modulation converter includes a digital signal processor (DSP).

16. The digital amplifier system of claim 13 in which said pulse width modulation converter includes a ΣΔ converter.

17. The digital amplifier system of claim 13 in which said pulse density modulation converter includes a power processor.

18. The digital amplifier system of claim 17 in which said power processor includes a resonant FET driver.

19. The digital amplifier system of claim 17 in which said switching amplifier includes a pair of MOSFET transistors independently driven by said power processor.

20. The digital amplifier system of claim 13 in which said pulse width modulation converter and said pulse density modulation converter are configured as a class T amplifier.

21. The digital amplifier system of claim 13 in which the capacitive load includes an actuator for a deformable mirror.

22. The digital amplifier system of claim 13 including a microprocessor for providing said digital input command.

23. The digital amplifier system of claim 13 in which said switching amplifier includes a ½ H bridge.

24. The digital amplifier system of claim 13 in which said switching amplifier includes a pair of MOSFET transistors.

25. The digital amplifier system of claim 24 in which said MOSFET transistors are N channel MOSFETS.

* * * * *